(12) United States Patent
Bettin

(10) Patent No.: US 12,015,100 B2
(45) Date of Patent: Jun. 18, 2024

(54) APPARATUS AND METHOD FOR MANUFACTURING A SOLAR CELL ARRANGEMENT

(71) Applicant: APPLIED MATERIALS ITALIA S.R.L., San Biagio di Callalta (IT)

(72) Inventor: Federico Bettin, Martellago (IT)

(73) Assignee: APPLIED MATERIALS ITALIA S.R.L., San Biagio di Callalta (IT)

(*) Notice: Subject to any disclaimer, the term of this patent is extended or adjusted under 35 U.S.C. 154(b) by 954 days.

(21) Appl. No.: 16/979,122

(22) PCT Filed: Mar. 8, 2018

(86) PCT No.: PCT/EP2018/055796
§ 371 (c)(1),
(2) Date: Sep. 8, 2020

(87) PCT Pub. No.: WO2019/170241
PCT Pub. Date: Sep. 12, 2019

(65) Prior Publication Data
US 2020/0403112 A1    Dec. 24, 2020

(51) Int. Cl.
*H01L 31/18* (2006.01)
*H01L 31/05* (2014.01)

(52) U.S. Cl.
CPC ........ *H01L 31/188* (2013.01); *H01L 31/0504* (2013.01)

(58) Field of Classification Search
CPC .... H01L 31/188; H01L 31/0504; Y02E 10/50
USPC ........................................................ 438/67
See application file for complete search history.

(56) References Cited

U.S. PATENT DOCUMENTS

| 2015/0030418 | A1  | 1/2015  | Reichenbach et al. |
| 2017/0323808 | A1* | 11/2017 | Gislon ................ H01L 31/0504 |

FOREIGN PATENT DOCUMENTS

| CN | 104868004    | A  | 8/2015  |
| CN | 206293457    | U  | 6/2017  |
| CN | 107735868    | A  | 2/2018  |
| WO | 2016/090341  | A1 | 6/2016  |
| WO | 2017/190800  | A1 | 11/2017 |

OTHER PUBLICATIONS

International Search Report and Written Opinion, PCT/EP2018/055796, Jan. 7, 2019.
Chinese Office Action dated Nov. 15, 2023 for Application No. 201880090621.X.

* cited by examiner

*Primary Examiner* — Caleen O Sullivan
(74) *Attorney, Agent, or Firm* — Patterson + Sheridan, LLP

(57) ABSTRACT

An apparatus includes a first processing line including a first cleaving unit adapted for separating a first solar cell into solar cell pieces. The apparatus includes a second processing line including a second cleaving unit adapted for separating a second solar cell into solar cell pieces. The apparatus includes a storing unit adapted for storing a plurality of solar cell pieces. The apparatus is adapted for transferring a solar cell piece from a first position on the first processing line to the storing unit. The apparatus is adapted for transferring the solar cell piece from the storing unit to a second position on the second processing line.

17 Claims, 10 Drawing Sheets

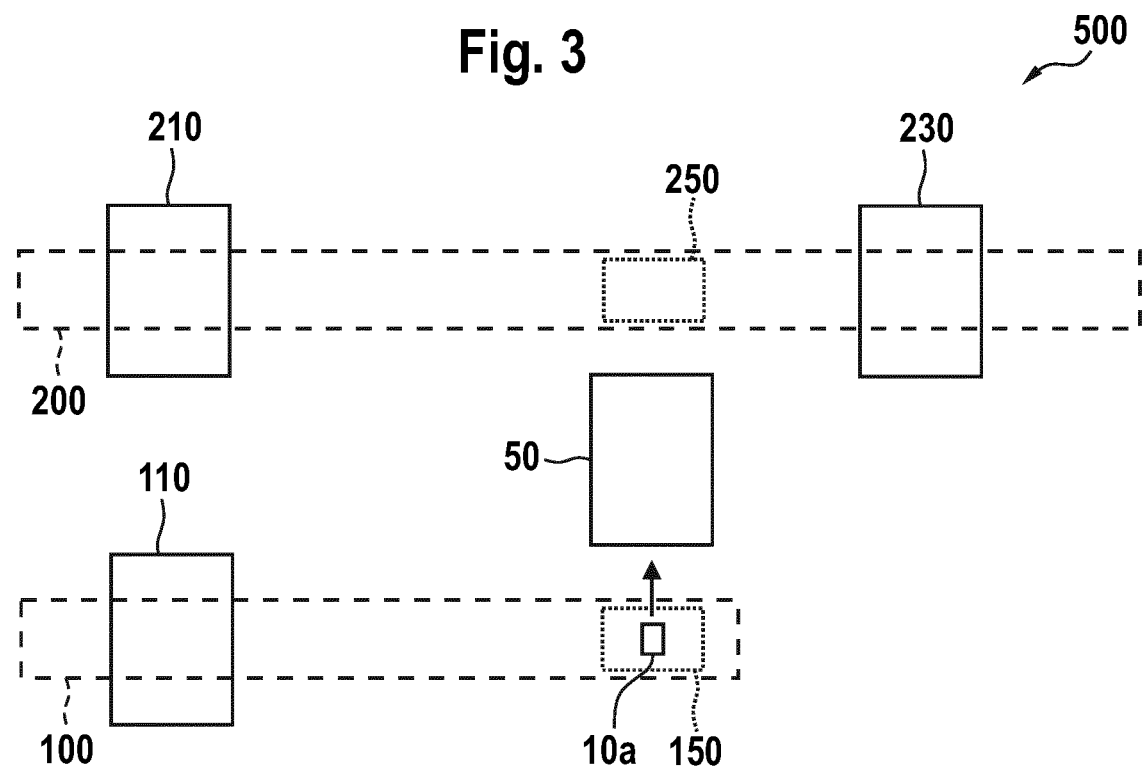
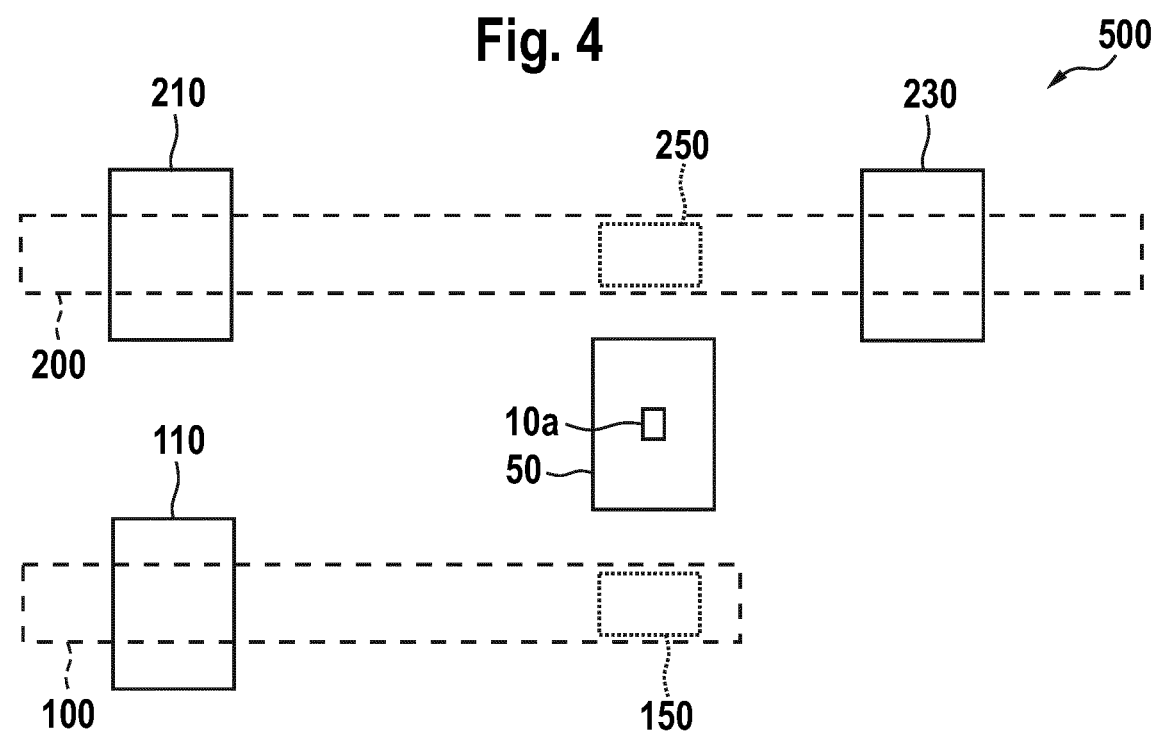

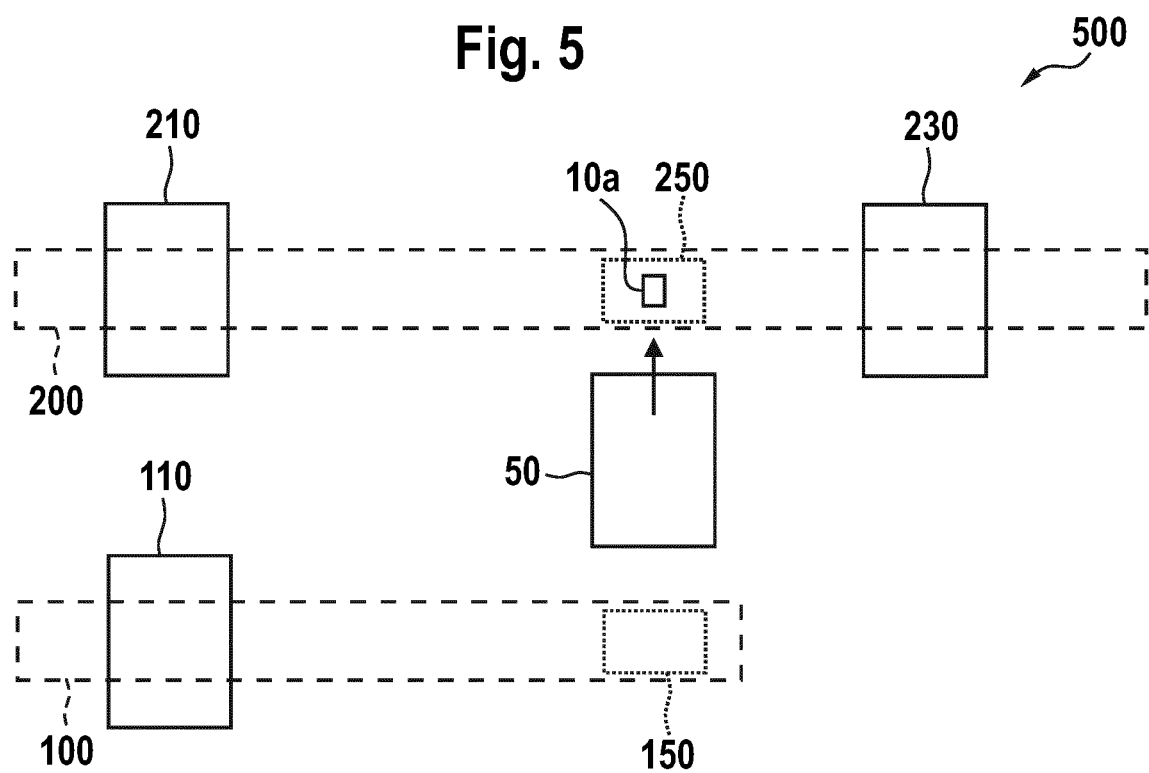
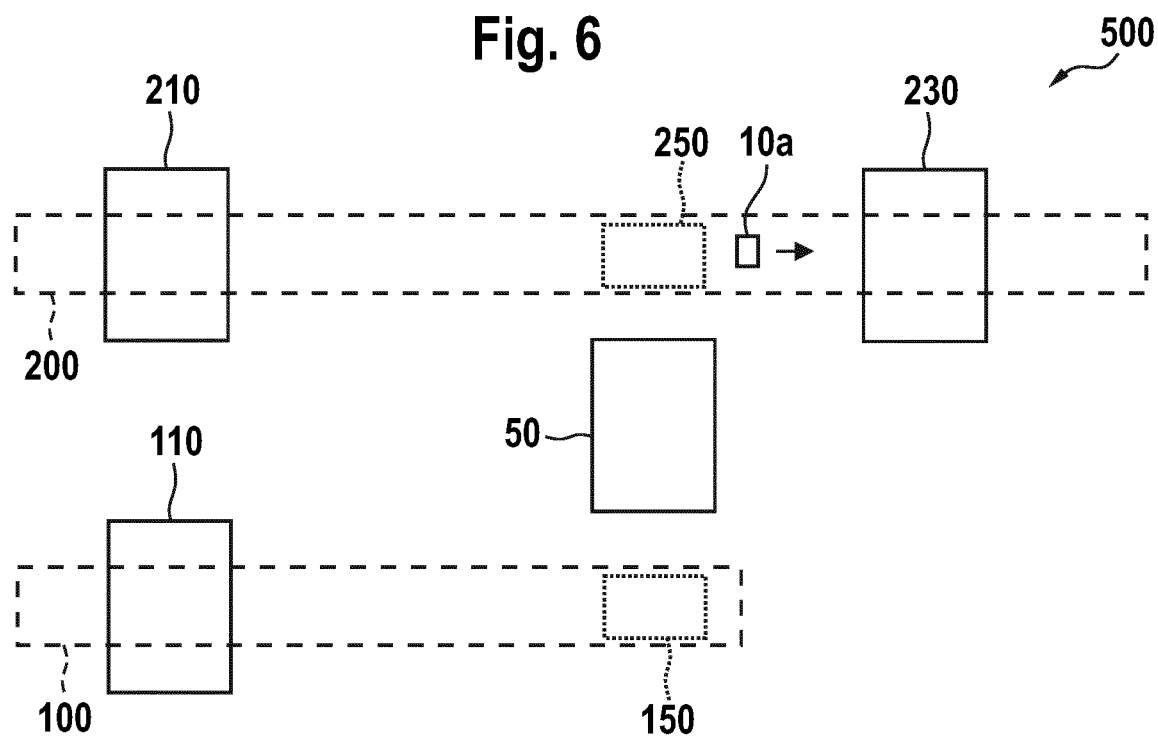

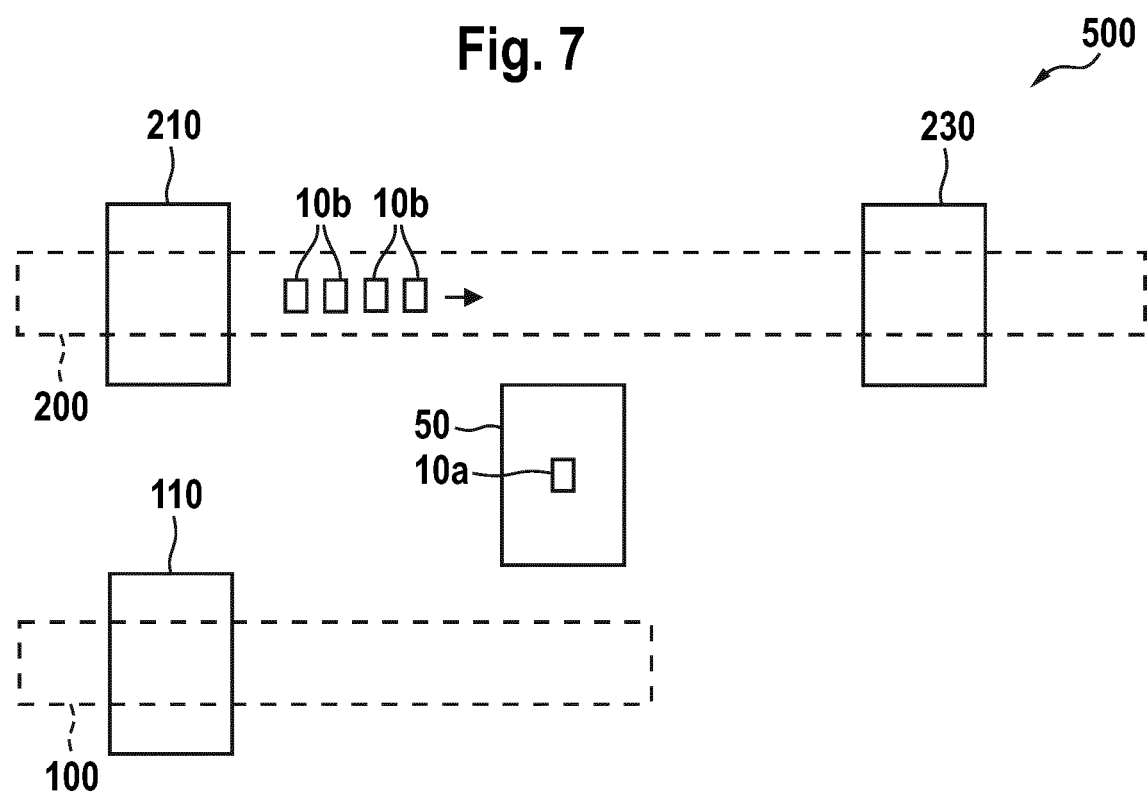
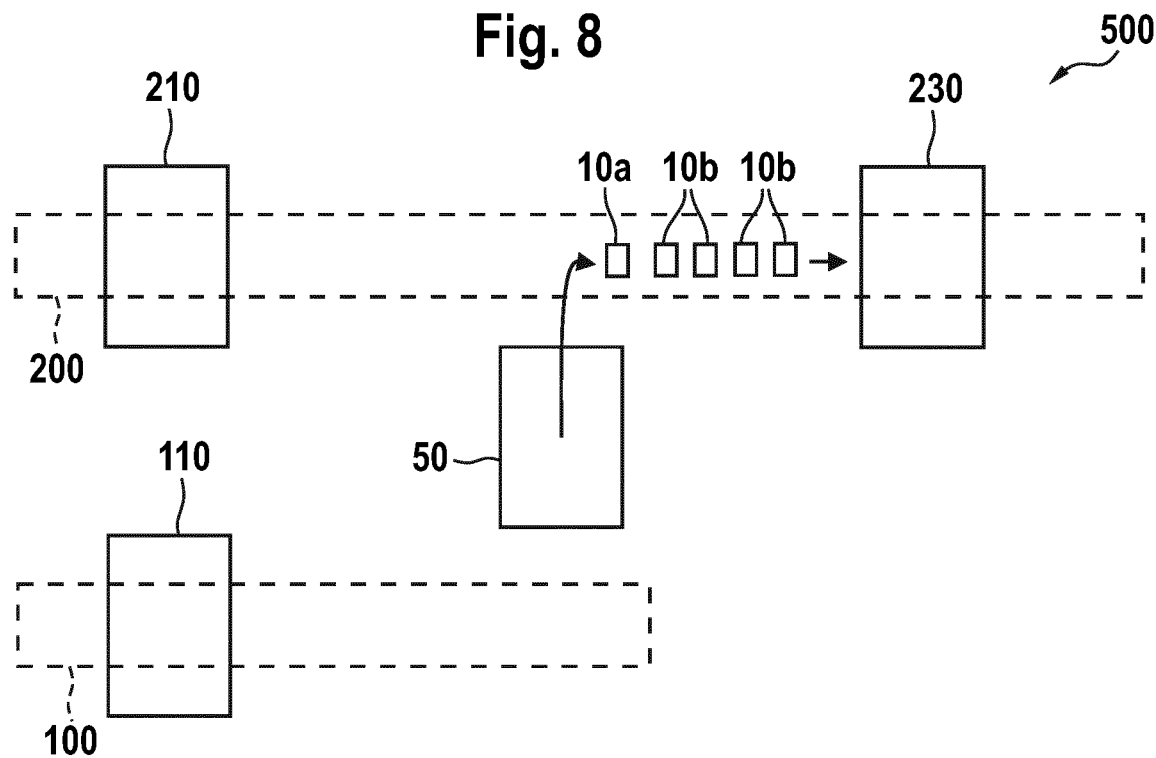

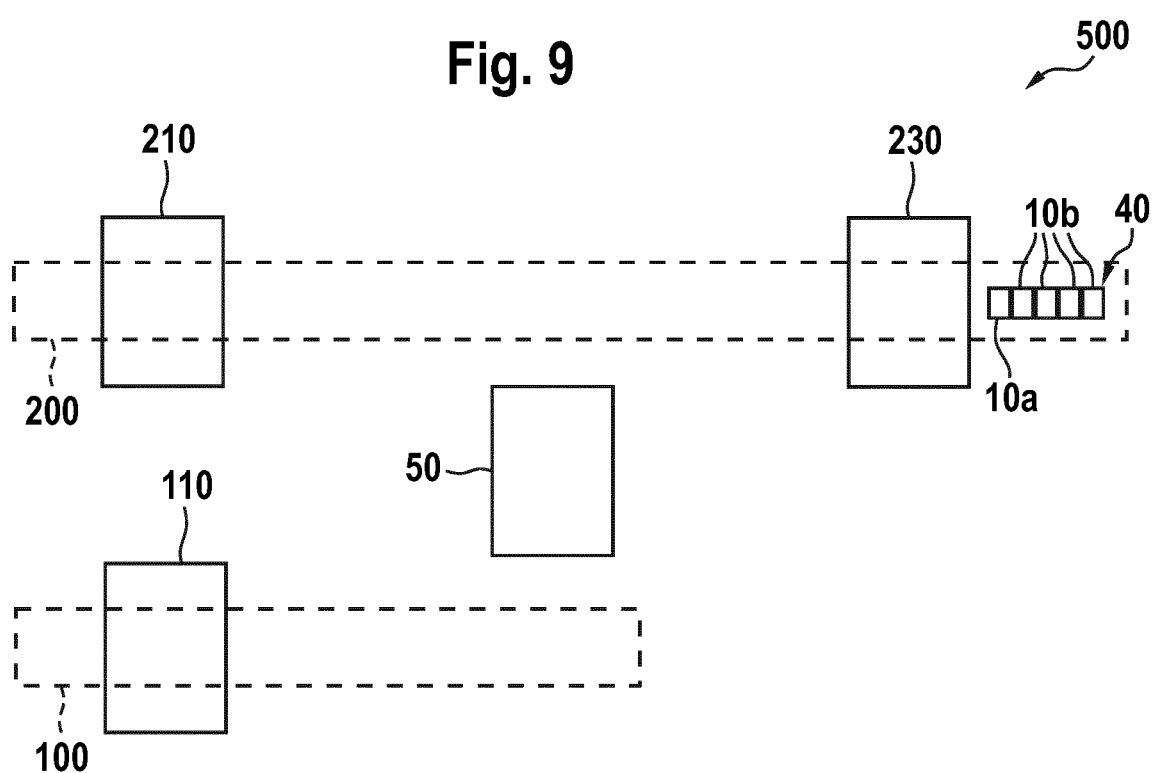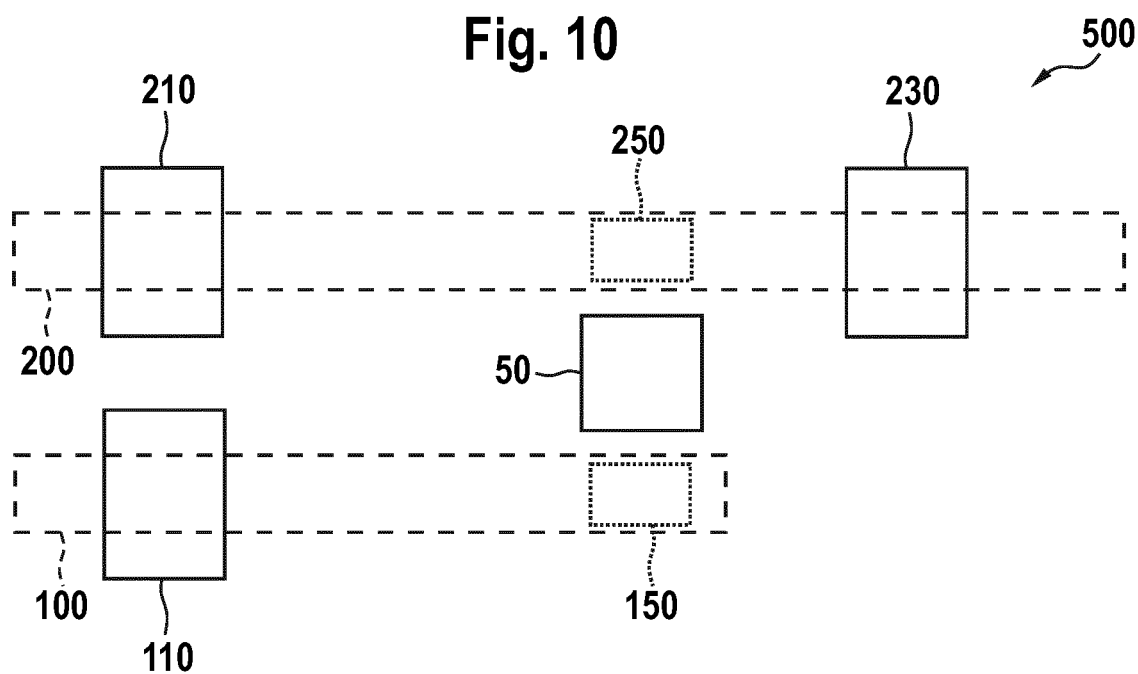

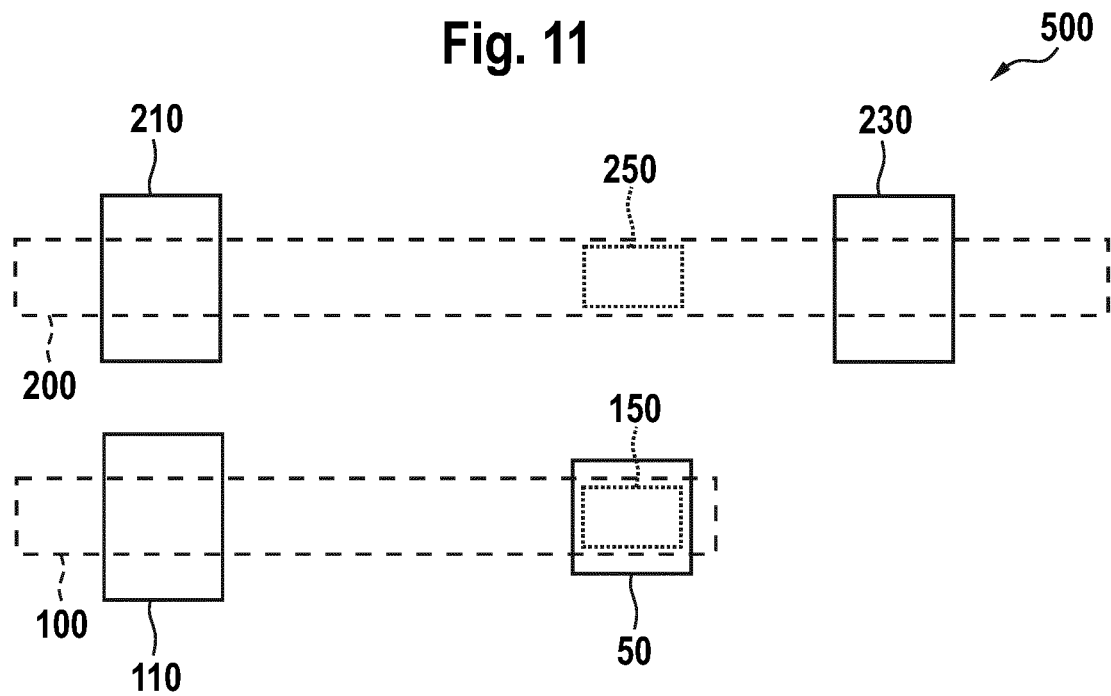
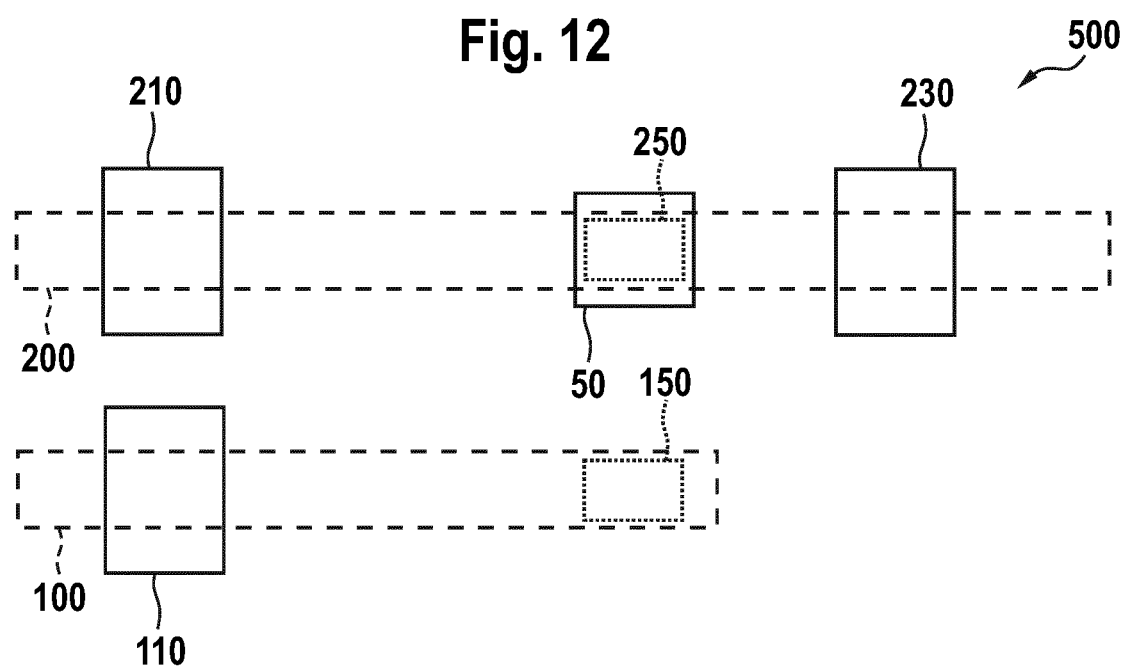

APPARATUS AND METHOD FOR MANUFACTURING A SOLAR CELL ARRANGEMENT

FIELD

Embodiments described herein relate to apparatuses and methods for manufacturing solar cell arrangements, more specifically shingled solar cell arrangements including a plurality of overlapping solar cell pieces. Apparatuses described herein can be adapted for cleaving a solar cell for separating the solar cell into solar cell pieces.

BACKGROUND

Solar cells are photovoltaic devices that convert sunlight directly into electrical power. The efficiency of the solar cells can be affected by an active area on a front surface of the solar cell which is exposed to light for converting sunlight into electrical power. The active area can be reduced due to the presence of electrical contacts, such as fingers and/or bus bars, on the front surface of the solar cells. The presence of the electrical contacts on the front surface of the solar cells can thus reduce a module power of a solar cell module including the solar cells.

Shingled solar cell arrangements can increase an output power of a solar cell module. The increase in the output power can be affected by a quality of a manufacturing process, such as a quality of the elements used to assemble the shingled solar cell arrangement. Further, a proper assembling of the shingled solar cell arrangement can be cumbersome, and a throughput and/or yield can be low.

In view of the above, new methods and apparatuses for processing solar cells for the manufacture of shingled solar cell arrangements that overcome at least some of the problems in the art are beneficial. The present disclosure particularly aims at improving the manufacturing process of solar cell arrangements, such as shingled solar cells.

SUMMARY

According to an embodiment, an apparatus is provided. The apparatus includes a first processing line including a first cleaving unit adapted for separating a first solar cell into solar cell pieces. The apparatus includes a second processing line including a second cleaving unit adapted for separating a second solar cell into solar cell pieces. The apparatus includes a storing unit adapted for storing a plurality of solar cell pieces. The apparatus is adapted for transferring a solar cell piece from a first position on the first processing line to the storing unit. The apparatus is adapted for transferring the solar cell piece from the storing unit to a second position on the second processing line.

According to a further embodiment, an apparatus is provided. The apparatus includes a storing unit adapted for storing a plurality of solar cell pieces. The apparatus includes a first processing line. The first processing line includes a first cleaving unit adapted for separating a first solar cell into solar cell pieces. The first processing line includes a first transportation system adapted for transporting a solar cell piece from the first cleaving unit to a first transfer area of the first processing line. The apparatus includes a second processing line. The second processing line includes a second cleaving unit adapted for separating a second solar cell into solar cell pieces. The second processing line includes an assembling unit adapted for assembling a solar cell arrangement comprising a plurality of overlapping solar cell pieces. The second processing line includes a second transportation system at least adapted for transporting a solar cell piece from a second transfer area of the second processing line to the assembling unit. The apparatus is adapted for transferring a solar cell piece from the first transfer area of the first processing line to the storing unit and for transferring the solar cell piece from the storing unit to the second transfer area of the second processing line.

According to a further embodiment, a method is provided. The method includes separating a first solar cell into a first plurality of solar cell pieces using a first cleaving unit. The first plurality of solar cell pieces includes a first solar cell piece. The method includes storing the first solar cell piece in a storing unit. The method includes transporting the first solar cell piece from the storing unit to an assembling unit. The method includes separating a second solar cell into a second plurality of solar cell pieces using a second cleaving unit, the second plurality of solar cell pieces comprising a second solar cell piece. The method includes transporting the second solar cell piece to the assembling unit. The method includes assembling a solar cell arrangement using the assembling unit, the solar cell arrangement comprising a plurality of overlapping solar cell pieces, the solar cell arrangement comprising the first solar cell piece and the second solar cell piece.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIGS. 2-6 illustrate the processing of a solar cell piece provided by a first cleaving unit of an apparatus according to embodiments described herein;

FIGS. 7-9 illustrate the manufacturing of a solar cell arrangement using an apparatus according to embodiments described herein;

FIGS. 10-12 show a moveable storing unit of an apparatus according to embodiments described herein;

DETAILED DESCRIPTION OF EMBODIMENTS

Figure 1:
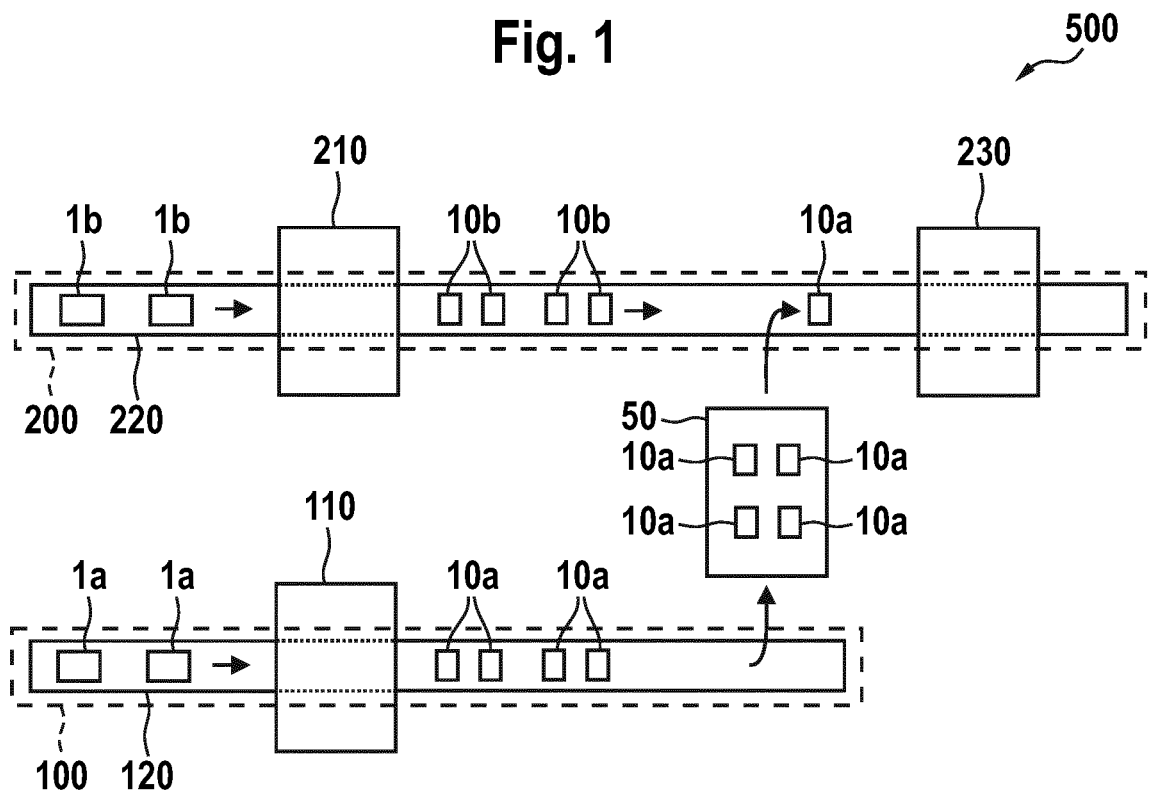
FIG. 1 shows an apparatus according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

A solar cell or solar cell piece, as described herein, may include a conductive structure or a conductive pattern, particularly a conductive line pattern. A conductive pattern or structure can include one or more bus bars and/or a plurality of fingers. The solar cell or solar cell piece can include a conductive pattern or structure on the front side of the solar cell or solar cell piece. Additionally or alternatively, a solar cell or solar cell piece can include a conductive pattern or structure on the back side of the solar cell or solar cell piece. For example, a solar cell or solar cell piece can include a first conductive pattern including one or more bus bars and a plurality of fingers on the front side of the solar cell or solar cell piece. The solar cell or solar cell piece can include a second conductive pattern including one or more bus bars on the back side of the solar cell or solar cell piece.

Embodiments described herein relate to shingled solar cell arrangements. A shingled solar cell arrangement can be made of a plurality of overlapping solar cell pieces. Adjacent solar cell pieces are electrically connected to each other in the overlapping region, e.g. via adhesives as described herein. The solar cell pieces are connected in series such that current generated by the individual solar cell pieces flows along the series of solar cell pieces to be collected, for example, at an end portion of the solar cell arrangement. The overlapping configuration can provide high-efficiency solar cell arrangements. In particular, the solar cell arrangements allow for increasing a solar cell module power by increasing a used or active area. Typically, the overlapping configuration can increase the module power by, for example, 20 to 40 Watts. The used or active area can correspond to an area that is irradiated by solar light and that participates in the generation of power. For example, the used or active area can correspond to an area of the solar cells that is not covered by, for example, conductive line patterns, such as fingers and/or bus bars.

According to an embodiment, an apparatus is provided. The apparatus includes a first processing line including a first cleaving unit adapted for separating a first solar cell into solar cell pieces. The apparatus includes a second processing line including a second cleaving unit adapted for separating a second solar cell into solar cell pieces. The apparatus includes a storing unit adapted for storing a plurality of solar cell pieces. The apparatus is adapted for transferring a solar cell piece from a first position on the first processing line to the storing unit. The apparatus is adapted for transferring the solar cell piece from the storing unit to a second position on the second processing line.

A processing line, as described herein, may include a plurality of processing units, or processing stations, arranged for processing solar cells and/or solar cell pieces. For example, a solar cell and/or solar cell piece may be processed sequentially by respective processing units arranged on a processing line. The solar cell or solar cell piece may be transported along the processing units. For example, a solar cell or solar cell piece may be processed by a first processing unit of the processing line. After processing by the first processing unit, a solar cell or solar cell piece may be transported from the first processing unit to a second processing unit, e.g. by way of a conveyor system. The solar cell or solar cell piece may subsequently be processed by the second processing unit. In some implementations, a solar cell or solar cell piece may subsequently be processed by a further processing unit on the processing line, such as e.g. a third processing unit, a fourth processing unit, and so on.

FIG. 1 shows an apparatus 500 according to embodiments described herein. The apparatus 500 includes a first processing line 100. The first processing line 100 includes a first cleaving unit 110 for separating solar cells 1a into solar cell pieces 10a. Solar cell pieces 10a provided by the first cleaving unit 110 are processed on the first processing line 100.

Cleaving a solar cell, as described herein, is performed for separating the solar cell into solar cell pieces, or solar cell shingles. Before cleaving a solar cell, a portion of the solar cell may be scribed, e.g. by a laser. Cleaving a solar cell may be performed at a scribed portion of the solar cell. The scribed portion provides a breaking location which facilitates separating the solar cell into solar cell pieces. The cleaving may include acting on the solar cell, e.g. on a scribed portion of the solar cell, by a force, particularly a substantially vertical force. The force is configured for separating the solar cell into solar cell pieces or solar cell shingles. By applying the force, the solar cell breaks into separate solar cell pieces, wherein the breaking location(s) may be defined by the scribed portion(s) on the solar cell.

The term "solar cell piece", as used herein, is distinguished from the term "solar cell". A solar cell piece, as described herein, refers to a portion or segment of a solar cell. A solar cell piece may be understood as a solar cell segment, or solar cell shingle. A solar cell piece may be a portion of a solar cell resulting from the cleaving of the solar cell. The area of a solar cell piece is smaller than the area of a solar cell. For example, the area of a solar cell piece may be 90% or less of the area of a solar cell. In some cases, a solar cell piece may have an area of 50% or less of the area of a solar cell.

The apparatus 500 shown in FIG. 1 includes a second processing line 200. The first processing line and the second processing line may be configured for operating in parallel.

The second processing line 200 includes a second cleaving unit 210 for separating solar cells 1b into solar cell pieces 10b. Solar cell pieces 10b provided by the second cleaving unit 210 are processed on the second processing line 200. As illustrated for example in FIG. 1, solar cell pieces 10a and solar cell pieces 10b may be processed in parallel on the first processing line 100 and the second processing line 200, respectively.

The apparatus 500 shown in FIG. 1 includes a storing unit 50 for storing a plurality of solar cell pieces. Solar cell pieces 10a processed on the first processing line 100 are supplied to the storing unit 50. The solar cell pieces 10a are stored in the storing unit 50. The storing unit 50 can be filled by solar cell pieces 10a provided by the first processing line, particularly by the first cleaving unit 110.

A storing unit, as described herein, may include or be a buffer or a cassette. In the storing unit, a plurality of solar cell pieces 10a may be stacked on top of each other. A storing unit may include a plurality of solar cell pieces, e.g. 5 or more, 50 or more, 100 or more or even 200 or more solar cell pieces. The plurality of solar cell pieces may be stored in the storing unit in a horizontal orientation. During the storing of a solar cell piece in the storing unit, the solar cell piece may not include an adhesive for connecting the solar cell piece to a further solar cell piece.

As shown for example in FIG. 1, a solar cell piece 10*a* stored in the storing unit 50 may be retrieved from the storing unit 50 for processing the solar cell piece 10*a* on the second processing line 200. Solar cell pieces 10*a* retrieved from the storing unit 50 and solar cell pieces 10*b* provided by the second cleaving unit 210 can be processed on the second processing line 200.

A second processing line, as described herein, can be configured as an assembling line for assembling shingled solar cell arrangements. As shown for example in FIG. 1, a second processing line 200, as described herein, may comprise an assembling unit 230 adapted for assembling a solar cell arrangement comprising a plurality of overlapping solar cell pieces. The assembling unit 230 may be arranged downstream of the second cleaving unit 210 relative to a processing flow of the second processing line 200. Solar cell pieces 10*b* may be transported on the second processing line 200 from the second cleaving unit 210 to the assembling unit 230.

The assembling unit 230 may be adapted for assembling a solar cell arrangement, e.g. a shingled solar cell arrangement, including a plurality of overlapping solar cell pieces. The solar cell arrangement assembled by the assembling unit 230 can include a solar cell piece 10*b* provided by the second cleaving unit 210, particularly a plurality of solar cell pieces 10*b* provided by the second cleaving unit 210. The solar cell arrangement assembled by the assembling unit 230 can include a solar cell piece 10*a* retrieved from the storing unit 50.

The solar cell pieces 10*a* provided by the first processing line 100 for storage in the storing unit 50 may have a design different from a design of the solar cell pieces 10*b* processed on the second processing line 200. The design of a solar cell piece 10*a* provided by the first processing line 100 may be tailored to a function and/or position of the solar cell piece 10*a* in a shingled solar cell arrangement assembled on the second processing line 200. For example, a solar cell piece 10*a* provided by the first processing line 100 may be configured to be an outermost solar cell piece of a shingled solar cell arrangement. The solar cell piece 10*a* may, for example, not include an electrically conductive adhesive for connecting the solar cell piece 10*a* to an adjacent solar cell piece 10*b* of the solar cell arrangement assembled by the assembling unit 230.

When a solar cell piece, e.g. a solar cell piece for serving as an outermost solar cell piece of a solar cell arrangement, is needed, a solar cell piece 10*a* may be retrieved from the storing unit 50 and transferred to the second processing line 200.

According to embodiments described herein, the first processing line 100 provides for a separate processing line configured for supplying solar cell pieces for filling the storing unit 50. This provides the advantage that, for example, a manual filling of the storing unit 50 can be eliminated.

According to embodiments described herein, the first processing line 100 has an own cleaving unit, i.e. the first cleaving unit 110, for providing solar cell pieces to the storing unit 50. The second cleaving unit 210 of the second processing line 200 need not be used for filling the storing unit 50. This provides the advantage that the storing unit 50 can be filled independently of and in parallel with the processing of solar cell pieces on the second processing line 200. For example, the processing of solar cell pieces on the second processing line 200 need not be interrupted for supplying solar cell pieces from the second processing line 200 to the storing unit 50 for filling the storing unit 50. A separate processing line including a cleaving unit for filling the storing unit 50 with solar cell pieces 10*a* is provided by way of the first processing line 100. The throughput and efficiency of the solar cell processing can be improved, and the cycle time can be reduced.

As shown for example in FIG. 1, the first processing line 100 may include a first transportation system 120 adapted for transporting solar cell pieces.

As shown for example in FIG. 1, the second processing line 200 may include a second transportation system 220 adapted for transporting solar cell pieces. The second transportation system 220 may be adapted for transporting a solar cell piece 10*b* from the second cleaving unit 210 to the assembling unit 230. For example, the second transportation system 220 may include a conveyor, or a sequence of conveyors.

A processing line, as described herein, may include a transportation system for transporting solar cells or solar cell pieces along the processing line or along a portion of the processing line. The transportation system may comprise one or more conveyors for transporting the solar cells or solar cell pieces between different processing units or stations of the processing line. For example, the transportation system may include a first conveyor system for transporting a solar cell or solar cell piece from a first processing station of the processing line to a second processing station of the processing line. In some implementations, the transportation system may include a second conveyor system for transporting a solar cell or solar cell piece from the second processing station to a third processing station of the processing line. The transportation system may include further conveyors for transporting solar cells or solar cell pieces between further processing stations of the processing line. Alternatively, the transportation system may include a single conveyor for transporting the solar cells or solar cell pieces along a plurality of processing stations. For example, two, three, four or more processing stations of the processing line may be served by a same conveyor.

FIGS. 2-6 illustrate the processing of a solar cell piece 10*a* provided by the first cleaving unit 110 according to embodiments described herein.

Figure 2:
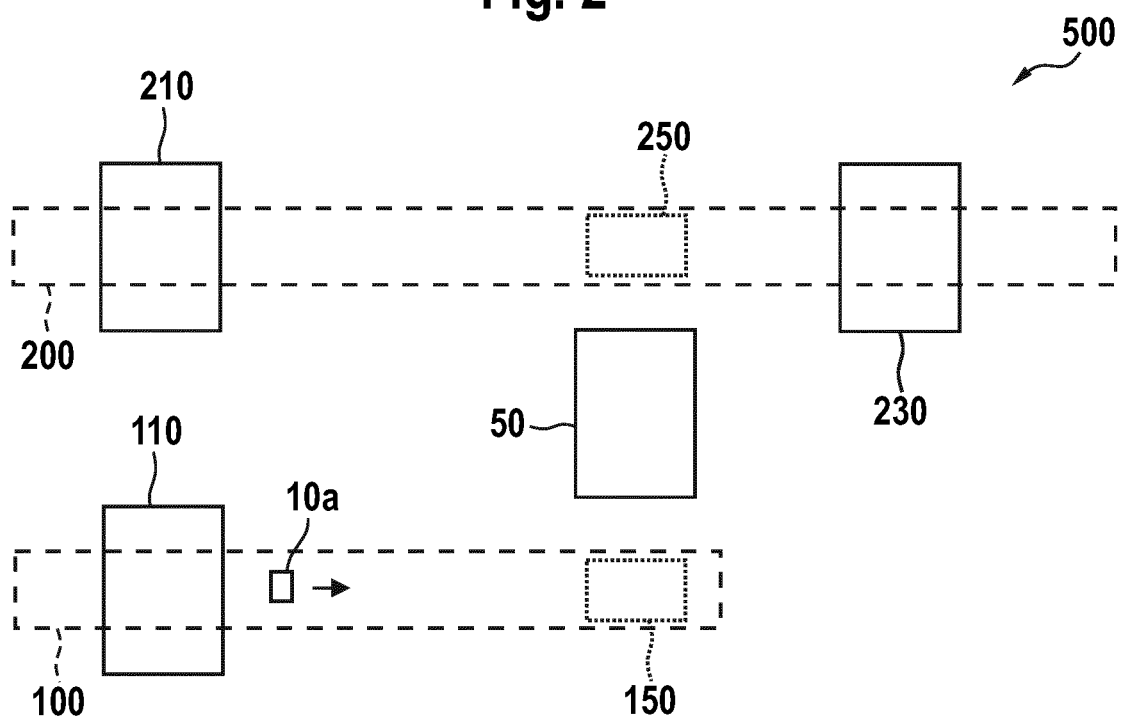

As shown for example in FIG. 2, a solar cell piece 10*a* may be provided by the first cleaving unit 110. The solar cell piece 10*a* may be provided by cleaving a solar cell (not shown) by the first cleaving unit 110. The solar cell piece 10*a* may be transported on the first processing line 100 to a position downstream of the first cleaving unit 110 relative to a processing flow of the first processing line. In FIG. 2, the solar cell piece 10*a* is transported on the first processing line 100 from left to right.

As shown for example in FIG. 3, the first processing line 100 may include a first transfer area 150, e.g. a pick-up area. A solar cell piece 10*a* may be transported on the first processing line 100 from the first cleaving unit 110 to the first transfer area 150. FIG. 3 shows the solar cell piece 10*a* of FIG. 2, the solar cell piece 10*a* being in the first transfer area 150.

An apparatus 500, as described herein, may be adapted for transferring a solar cell piece 10*a* from the first transfer area 150 to the storing unit 50. The transfer of a solar cell piece 10a from the first transfer area 150 to the storing unit 50 may be provided according to various possible implementations, as described herein. For example, the storing unit 50 may be a moveable storing unit which can be moved to a position in or adjacent to the first transfer area 150. Several other implementations for transferring a solar cell piece from the first transfer area 150 to the storing unit 50 are described herein.

FIG. 4 shows the solar cell piece 10a of FIG. 3 after the solar cell piece 10a has been transferred from the first transfer area 150 to the storing unit 50. The solar cell piece 10a may be stored in the storing unit 50 for a certain period of time.

As shown for example in FIG. 5, the second processing line 200 may include a second transfer area 250, e.g. a drop-off area. The second transfer area 250 may be downstream of the second cleaving unit 210 relative to a processing flow of the second processing line 200. The second transfer area 250 may be upstream of the assembling unit 230 relative to a processing flow of the second processing line 200.

As shown for example in FIG. 5, the apparatus 500 may be adapted for transferring a solar cell piece 10a from the storing unit 50 to the second transfer area 250 of the second processing line 200. For example, the transfer of the solar cell piece 10a from the storing unit 50 to the second transfer area 250 may be undertaken in response to an instruction from a control unit (not shown) that a solar cell piece is to be retrieved from the storing unit 50 for processing the solar cell piece on the second processing line 200.

The transfer of a solar cell piece 10a from the storing unit 50 to the second transfer area 250 may be implemented according to various possible implementations, as described herein. For example, the storing unit 50 may be a moveable storing unit. The storing unit 50 including the solar cell piece 10a can be moved to a position in or adjacent to the second transfer area 250. Several other implementations for transferring a solar cell piece 10a from the storing unit 50 to the second transfer area 250 are described herein.

As shown for example in FIG. 6, a solar cell piece 10a that was transferred from the storing unit 50 to the second transfer area 250 may be transported on the second processing line 200 from the second transfer area 250 to the assembling unit 230. The assembling unit 230 may be adapted for assembling a solar cell arrangement comprising a plurality of overlapping solar cell pieces. The solar cell arrangement may include the solar cell piece 10a. Additionally, the solar cell arrangement may include a plurality of solar cell pieces provided by the second cleaving unit 210 and transported from the second cleaving unit 210 to the assembling unit 230 on the second processing line 200.

For the sake of the intelligibility of the exposition, FIGS. 2-6 only show the processing of one solar cell piece 10a. However, in parallel to the processing of the solar cell piece 10a shown in FIGS. 2-6, a plurality of further solar cell pieces may be processed by the apparatus. For example, during the processing of the solar cell piece 10a as shown in FIGS. 2-6, a plurality of further solar cell pieces may be processed on the first processing line 100, e.g. solar cell pieces may be provided by the first cleaving unit 110 and transported from the first cleaving unit 110 to the storing unit 50 as described herein. Alternatively or additionally, in parallel with the processing of the solar cell piece 10a as shown in FIGS. 2-6, a plurality of further solar cell pieces may be processed on the second processing line 200, e.g. solar cell pieces may be provided by the second cleaving unit 210 and transported from the second cleaving unit 210 to the assembling unit 230 as described herein.

The first processing line, as described herein, may include a first transfer area, e.g. a pick-up area. The apparatus may be adapted for transferring a solar cell piece from the first transfer area to the storing unit. The first transfer area may be downstream of the first cleaving unit relative to a processing flow of the first processing line. The first transportation system may be adapted for transporting a solar cell piece from the first cleaving unit to the first transfer area.

In some implementations, the first processing line may terminate at the first transfer area. This is to be understood in the sense that the first processing line may not be configured for processing a solar cell piece downstream of the first transfer area. The first transfer area may be the last area for processing solar cell pieces on the first processing line. Downstream of the first transfer area, the first processing line may not include a processing station for processing a solar cell piece provided by the first cleaving unit.

The second processing line, as described herein, may include a second transfer area, e.g. a drop-off area. The apparatus may be adapted for transferring a solar cell piece from the storing unit to the second transfer area. The second transfer area may be upstream of the assembling unit of the second processing line. The second transportation system may be adapted for transporting a solar cell piece from the second transfer area to the assembling unit of the second processing line. The second transfer area may be downstream of the second cleaving unit relative to a processing flow of the second processing line.

FIGS. 7-9 illustrate the assembling of a solar cell arrangement according to embodiments described herein.

FIG. 7 shows an apparatus 500 according to embodiments described herein. As shown for example in FIG. 7, solar cell pieces 10b provided by the second cleaving unit 210 may be transported on the second processing line 200 (e.g. by the second transportation system as described herein) from the second cleaving unit 210 towards the assembling unit 230. A solar cell piece 10a may be stored in the storing unit 50. The solar cell piece 10a may have been supplied to the storing unit 50 by the first processing line 100, as described herein.

FIG. 8 shows the apparatus 500 of FIG. 7 at a later moment in time. The solar cell pieces 10b shown in FIG. 8 have been transported on the second processing line 200 to a position further downstream of the second cleaving unit 210, i.e. closer to the assembling unit 230. The solar cell piece 10a shown in FIG. 8 has been transferred from the storing unit 50 to a position on the second processing line 200. In the example shown in FIG. 8, the solar cell piece 10a on the second processing line 200 is in a position behind the solar cell pieces 10b, i.e. the solar cell pieces 10b are followed by the solar cell piece 10a on the second processing line 200.

The solar cell pieces 10b and the solar cell piece 10a may be transported on the second processing line 200 to the assembling unit 230. The solar cell pieces 10b and the solar cell piece 10a may be assembled by the assembling unit 230 to form a solar cell arrangement, e.g. a shingled solar cell arrangement. For example, the solar cell pieces 10a and 10b may be electrically and mechanically connected to each other via adhesives, e.g. electrically conducting adhesives, as described herein. After connecting the solar cell pieces together, the shingled solar cell arrangement may be cured.

FIG. 9 shows the apparatus 500 of FIG. 8 at yet a later moment in time. A solar cell arrangement 40 has been assembled on the second processing line 200 by the assembling unit 230. The solar cell arrangement 40 includes a plurality of overlapping solar cell pieces, namely the solar cell pieces 10b and the solar cell piece 10a.

As shown for example in FIG. 9, the solar cell piece 10a may be the last solar cell piece of the solar cell arrangement 40. With respect to a process flow of the second processing line 200, the solar cell pieces 10b of the solar cell arrangement 40 may be followed by the solar cell piece 10a.

In a solar cell arrangement 40 comprising a plurality of overlapping solar cell pieces, as described herein, an outermost solar cell piece of the solar cell arrangement 40 may have a design, or layout, which is different from the design or layout of other, e.g. inner, solar cell pieces of the solar cell arrangement. For example, an inner solar cell piece of a solar cell arrangement may include an adhesive, e.g. an electrically conductive adhesive, for connecting the solar cell piece to an adjacent solar cell piece of the solar cell arrangement. An outermost solar cell piece of the solar cell arrangement, e.g. the last solar cell piece of the solar cell arrangement, may not include an adhesive for connecting the last solar cell piece to a further solar cell piece of the solar cell arrangement.

Embodiments described herein provide the advantage that solar cell pieces 10a having a specific design tailored to the function of e.g. the last solar cell piece of a solar cell arrangement 40 may be stored in the storing unit 50 and retrieved on demand for processing on the second processing line 200. For example, solar cell pieces 10a not including an adhesive may be stored in the storing unit. By transporting such a solar cell piece 10a on demand to the assembling unit 230 of the second processing line 200, a solar cell arrangement 40 wherein the last solar cell piece does not include an adhesive may be manufactured.

For example, in the process illustrated in FIGS. 7-9, each of the solar cell pieces 10b may include a respective adhesive, e.g. an electrically conductive adhesive. The adhesives may be provided, e.g. printed, by an adhesive application unit arranged on the second processing line 200. For example, the adhesives may be printed on the respective solar cell pieces 10b on the second processing line 200 in an area downstream of the second cleaving unit 210. Alternatively, the adhesives may be printed on one or more solar cells, before said solar cells are cleaved to form the solar cell pieces 10b. After the adhesives are provided, e.g. printed, on the solar cells, the solar cells including the adhesives may be cleaved by the second cleaving unit 210 to form solar cell pieces 10b including the adhesives.

In each of the configurations shown in FIGS. 7-9, the solar cell piece 10a may not include an adhesive for connecting the solar cell piece 10a to an adjacent solar cell piece 10b of the solar cell arrangement 40. When assembling the solar cell arrangement 40 shown in FIG. 9, two adjacent solar cell pieces 10b of the solar cell arrangement 40 can be connected to each other via an adhesive provided on one of the solar cell pieces 10b. The solar cell piece 10a, i.e. the last solar cell piece of the solar cell arrangement 40, may be connected to the adjacent solar cell piece 10b of the solar cell arrangement 40 via an adhesive provided on the adjacent solar cell piece 10b. For example, in the solar cell arrangement 40 shown in FIG. 9, the solar cell piece 10a may not include an adhesive for connecting the solar cell piece 10a to the adjacent solar cell piece 10b. An adhesive on the solar cell piece 10a may not be necessary, since an adhesive for connecting the solar cell piece 10a and the adjacent solar cell piece 10b to each other may be provided on the adjacent solar cell piece 10b.

The first processing line, as described herein, may not include an adhesive printing unit for printing an adhesive on a solar cell piece. The first processing line may not include an adhesive application unit for applying an adhesive to a solar cell piece.

An apparatus, as described herein, may include a control unit configured for controlling the transfer of a solar cell piece 10a from a position on the first processing line to the storing unit, and/or for controlling the transfer of a solar cell piece 10a from the storing unit to a position on the second position on the second processing line.

A transfer of a solar cell piece 10a from the storing unit 50 to a position on the second processing line 200 may be a controlled transfer, such as an "on-demand" transfer. A solar cell piece 10a may be stored in the storing unit 50, e.g. a buffer. The solar cell piece 10a may be transferred from the storing unit 50 to a position on the second processing line 200 in response to an instruction from a control unit. The instruction may be sent by the control unit to the first processing line. For example, the instruction may be sent to the storing unit. A solar cell piece 10a may be retrieved from the storing unit 50 depending on a process condition of the second processing line 200. The process condition may be associated to, or depend on, a position of solar cell pieces 10b on the second processing line 200. For example, as a plurality of solar cell pieces 10b are transported on the second processing line 200 towards the assembling unit 230, an instruction may be sent that a solar cell piece 10a stored in the storing unit 50 is to be retrieved from the storing unit 50 for processing on the second processing line 200. For example, the instruction may be sent at a time when a last solar cell piece for a solar cell arrangement 40 is needed. In response to the instruction, a solar cell piece 10a may be retrieved from the storing unit 50 for processing on the second processing line 200. The solar cell piece 10a and the solar cell pieces 10b may be transported on the second processing line 200 to the assembling unit 230 for assembling the solar cell pieces 10a and 10b into a solar cell arrangement 40, as described herein.

An apparatus, as described herein, may be adapted for transferring a solar cell piece from a position on the first processing line to the storing unit. For example, the apparatus may be adapted for transferring the solar cell piece from the first transportation system to the storing unit. The apparatus may be adapted for transferring a solar cell piece from the storing unit to a position on the second processing line. For example, the apparatus may be adapted for transferring the solar cell piece from the storing unit to the second transportation system.

For example, the storing unit may be a moveable storing unit. The moveable storing unit may be adapted for moving to a position on or near the first processing line for receiving a solar cell piece from the first processing line. The moveable storing unit may be adapted for moving to a position on or near the second processing line for dropping off a solar cell piece stored in the storing unit on the second processing line. By the moveable storing unit, the apparatus can be adapted for transferring a solar cell piece from a position on the first processing line to the storing unit and for transferring the solar cell piece from the storing unit to a position on the second processing line.

A storing unit, as described herein, may be moveable from a first storing unit position for receiving a solar cell piece from the first processing line to a second storing unit position for supplying the solar cell piece to the second processing line. The storing unit may be moveable from the second storing unit position to the first storing unit position.

The apparatus may include an actuator, e.g., a motor, for moving the storing unit. The storing unit may be a motorized storing unit.

FIGS. 10-12 show an apparatus 500 according to embodiments described herein. The apparatus 500 includes a moveable storing unit.

FIG. 10 shows the storing unit 50 in a position between the first processing line 100 and the second processing line 200.

FIG. 11 shows the storing unit 50 in a first storing unit position. The storing unit 50 can be moveable from the position shown in FIG. 10 to the first storing unit position shown in FIG. 11.

The first storing unit position, as described herein, is a position of the storing unit for receiving a solar cell piece from the first processing line 100. The first storing unit position may be a position on or adjacent to the first processing line 100. As shown for example in FIG. 11, the first storing unit position may be a position in or adjacent to the first transfer area 150 of the first processing line. The apparatus 500 may be adapted for transferring a solar cell piece from the first processing line 100, particularly from the first transfer area 150 of the first processing line 100, to the storing unit 50 in the first storing unit position.

Several possibilities for transferring a solar cell piece from a position on the first processing line to the storing unit 50 can be provided. For example, a pick-up device may pick up a solar cell piece located in the first transfer area 150 and transfer the solar cell piece to the storing unit 50. Alternatively, the first processing line 100 may include a conveyor belt system which guides the solar cell piece directly into the storing unit 50 without the need for a separate pick-up device.

FIG. 12 shows the storing unit 50 in a second storing unit position. The storing unit 50 can be moveable from the first storing unit position to the second storing unit position, and vice versa.

The second storing unit position, as described herein, is a position of the storing unit 50 for transferring a solar cell piece from the storing unit 50 to a position on the second processing line 200. The second storing unit position may be a position on or adjacent to the second processing line 200. As shown for example in FIG. 12, the second storing unit position may be a position in or adjacent to the second transfer area 250 of the second processing line 200. The apparatus 500 may be adapted for transferring a solar cell piece from the storing unit 50 in the second storing unit position to the second processing line 200, particularly to the second transfer area 250 of the second processing line 200.

Several possibilities for transferring a solar cell piece from the storing unit 50 to a position on the second processing line 200 can be provided. For example, a pick-up device may remove a solar cell piece from the storing unit and place the solar cell piece in a position on the second processing line. Alternatively, the storing unit 50 itself may be adapted for guiding a solar cell piece out of the storing unit 50 to a position on the second processing line 200, without the need for a separate pick-up device.

Figure 13:
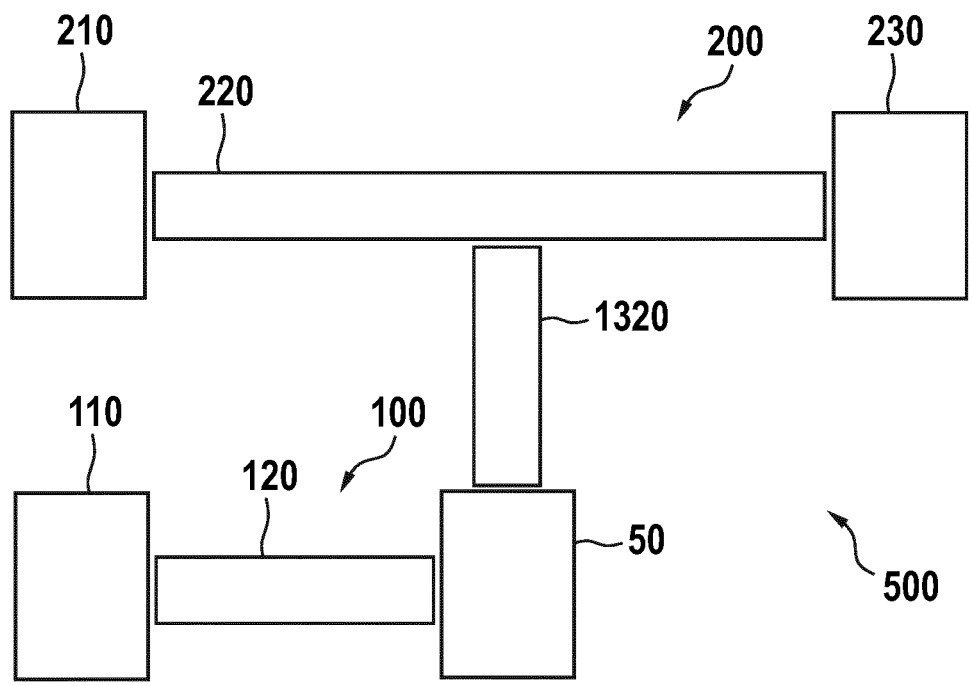
FIGS. 13-14 show apparatuses according to embodiments described herein involving different arrangements of the storing unit.
Figure 14:
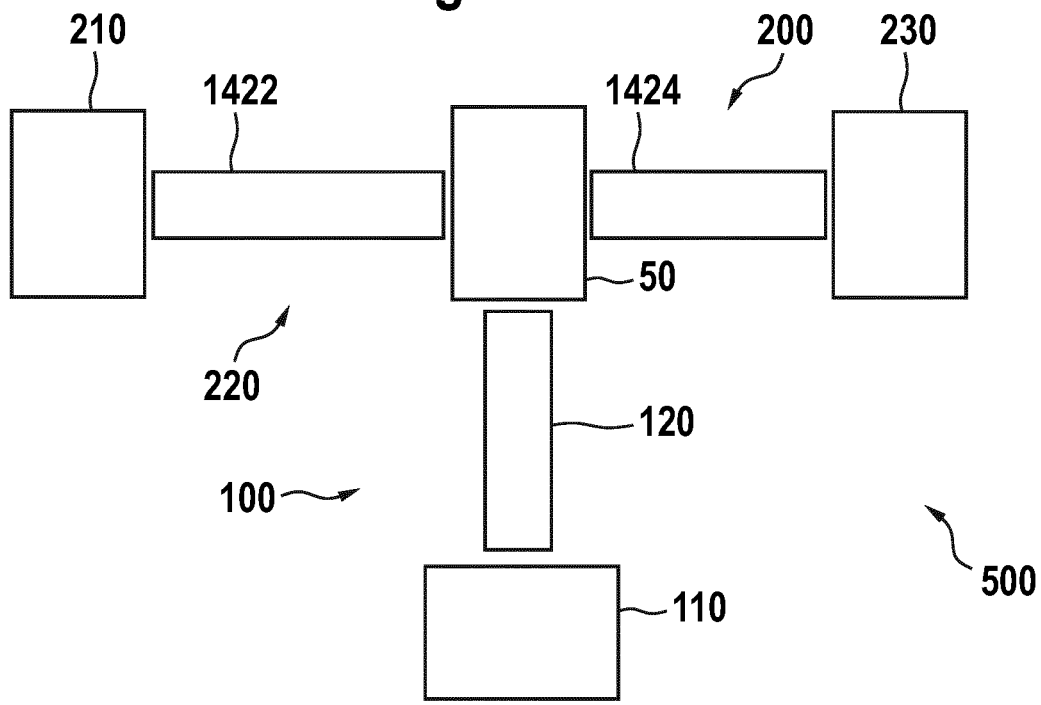

FIGS. 13-14 show further configurations of an apparatus 500 allowing for a transfer of a solar cell piece from a position on the first processing line 100 to the storing unit 50 and for a transfer of the solar cell piece from the storing unit 50 to a position on the second processing line 200. The apparatuses shown in FIGS. 13-14 include a stationary storing unit 50.

FIG. 13 shows an apparatus 500 according to embodiments described herein.

As shown for example in FIG. 13, the storing unit 50, e.g. a stationary storing unit, may be arranged in a position on or adjacent to the first processing line 100. The storing unit 50 may be included in the first processing line 100.

As shown for example in FIG. 13, the first processing line 100 may include a first transportation system 120. The first transportation system 120 may be adapted for transporting a solar cell piece from the first cleaving unit 110 to the storing unit 50.

As shown for example in FIG. 13, the apparatus 500 may include a guiding system 1320 adapted for transporting a solar cell piece from the storing unit 50 to the second processing line 200. The guiding system 1320 may for example include one or more conveyors. The guiding system 1320 may be included in the first processing line 100. For example, the guiding system 1320 may be included in the first transportation system 120 of the first processing line 100. Alternatively, the guiding system 1320 may be part of a further processing line different from the first processing line. The further processing line may be adapted for transporting solar cell pieces from the storing unit 50 to the second processing line 200.

The guiding system 1320 may be adapted for transporting a solar cell piece from the storing unit 50 to the second transportation system 220 of the second processing line 200. The solar cell piece may be transported by the second transportation system 220 to the assembling unit 230.

A storing unit as described herein, e.g. a stationary storing unit, may be arranged in a storing unit position for receiving a solar cell piece from the first processing line. The first processing line may include the storing unit. The apparatus may comprise a transfer device for transferring the solar cell piece from the storing unit to the second processing line. The transfer device may be a guiding system, e.g. guiding system 1320. The transfer device may include one or more conveyors.

FIG. 14 shows an apparatus 500 according to embodiments described herein.

As shown for example in FIG. 14, the first processing line 100 may include a first transportation system 120. The first transportation system 120 may be adapted for transporting a solar cell piece from the first cleaving unit 110 to the storing unit 50.

As shown for example in FIG. 14, the storing unit 50, e.g. a stationary storing unit, may be arranged in a position on or adjacent to the second processing line 200. The storing unit 50 may be included in the second processing line 200.

As shown for example in FIG. 14, the second transportation system 220 may be adapted for transporting a solar cell piece from the storing unit 50 to the assembling unit 230. The second transportation system 220 may include a guiding system 1422 and a guiding system 1424. The guiding system 1424 may be adapted for transporting a solar cell piece from the storing unit 50 to the assembling unit 230. The guiding system 1422 may be adapted for guiding a solar cell piece provided by the second cleaving unit 210 from the second cleaving unit 210 to an area near the storing unit 50.

A storing unit as described herein, e.g. a stationary storing unit, may be arranged in a storing unit position for supplying a solar cell piece to the second processing line. The second processing line may include the storing unit.

Figure 15:
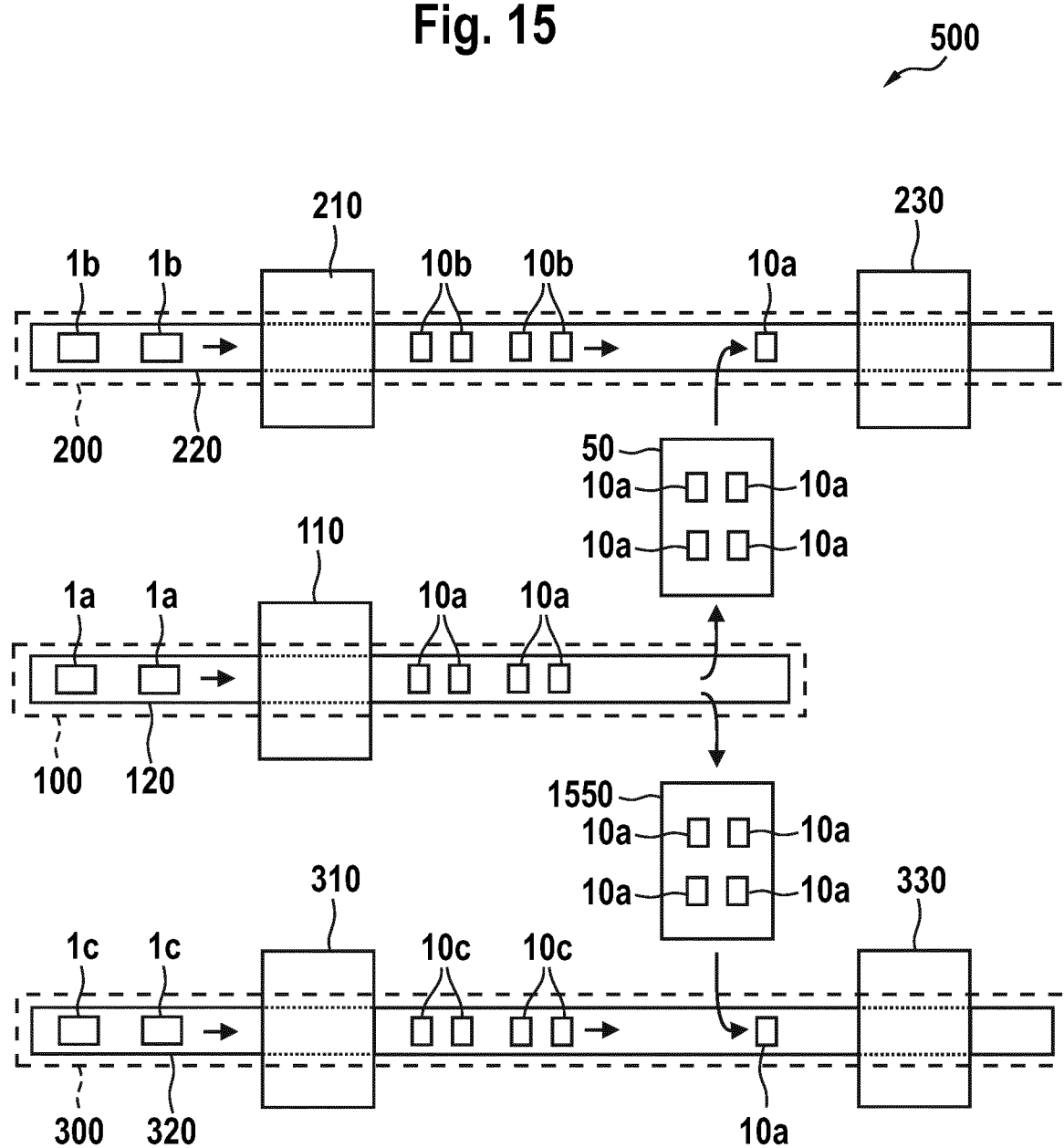
FIGS. 15-16 show apparatuses according to embodiments described herein including three processing lines.

FIG. 15 shows an apparatus 500 according to embodiments described herein. The apparatus 500 includes a first processing line 100, a second processing line 200 and a storing unit 50 as described herein, e.g. similar to the apparatus 500 shown in FIG. 1.

As shown for example in FIG. 15, an apparatus 500 may include a third processing line 300, e.g. an additional assembling line for assembling shingled solar cell arrangements. As shown, the first processing line 100 can be arranged between the second processing line 200 and the third processing line 300.

As shown for example in FIG. 15, the third processing line 300 may include a third cleaving unit 310. Solar cells 1c can be separated into solar cell pieces 10c by the third cleaving unit 310. The third processing line 300 may include a further assembling unit 330 adapted for assembling a solar cell arrangement including a plurality of overlapping solar cell pieces. The third processing line 300 may include a third transportation system 320 adapted for transporting solar cell pieces 10c, e.g. from the third cleaving unit 310 to the further assembling unit 330.

As shown for example in FIG. 15, an apparatus 500 may include a further storing unit 1550. The apparatus may be adapted for transferring a solar cell piece 10a from a position on the first processing line 100 to the further storing unit 1550. The apparatus may be adapted for filling the further storing unit 1550 using solar cell pieces 10a from the first processing line 100.

As shown for example in FIG. 15, the apparatus may be adapted for transferring a solar cell piece 10a from the further storing unit 1550 to a position on the third processing line 300. The solar cell piece 10a may be transported on the third processing line 300 to the further assembling unit 330. A solar cell arrangement including the solar cell piece 10a retrieved from the further storing unit 1550 and a plurality of solar cell pieces 10c provided by the third cleaving unit 310 may be assembled by the further assembling unit 330. The solar cell piece 10a retrieved from the further storing unit 1550 may be an outermost solar cell piece, particularly the last solar cell piece, of the solar cell arrangement.

The further storing unit 1550 may be a moveable storing unit or a stationary storing unit, like the storing unit 50. The possible configurations discussed in relation to the storing unit 50 for transferring a solar cell piece from the first processing line 100 to the storing unit 50 and for transferring a solar cell piece from the storing unit 50 to the second processing line 200 apply likewise to the further storing unit 1550 and the third processing line 300.

The first processing line 100, the second processing line 200 and the third processing line 300 may be adapted for operating in parallel.

The configuration shown in FIG. 15 provides for a single processing line, i.e. the first processing line 100, which is adapted for supplying solar cell pieces for filling both the storing unit 50 assigned to the second processing line 200 and the further storing unit 1550 assigned to the third processing line 300. This provides for a yet further increase in the productivity of the system, while at the same time keeping the footprint of the apparatus at a minimum.

Figure 16:
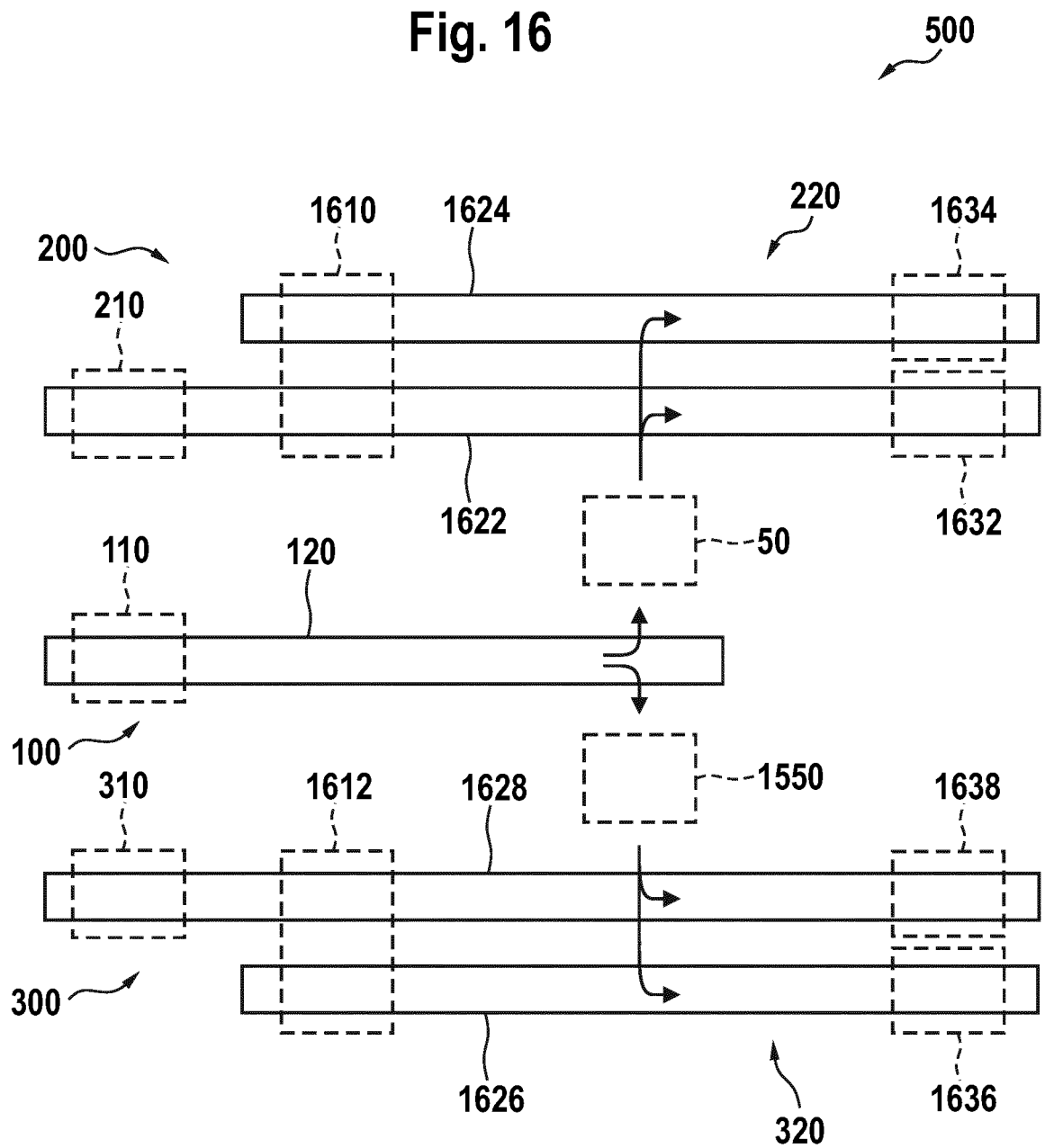

FIG. 16 shows an apparatus 500 according to embodiments described herein.

As shown for example in FIG. 16, the second transportation system 220 of the second processing line 200 may include a guiding system 1622 and a guiding system 1624. The second processing line 200 may include an assembling unit 1632 and assembling unit 1634. The second processing line 200 may include a sorting unit 1610. Solar cell pieces provided by the second cleaving unit 210 may be sorted by the sorting unit 1610, e.g. depending on the shape of the solar cell pieces.

For example, square shaped solar cell pieces (such as e.g. solar cell piece 20 shown in FIG. 18) may be transported from the second cleaving unit 210 to the assembling unit 230 by the guiding system 1622. The assembling unit 1632 may be adapted for assembling a shingled solar cell arrangement including, e.g., square shaped solar cell pieces only.

The storing unit 50 may include, e.g., square shaped solar cell pieces and trapezoid shaped solar cell pieces. A square shaped solar cell piece may be retrieved from the storing unit 50 and transferred to the guiding system 1622. The square shaped solar cell piece retrieved from the storing unit 50 may be included as the last solar cell piece of a solar cell arrangement assembled by the assembling unit 1632.

For example, trapezoid shaped solar cell pieces (such as e.g. solar cell pieces 30 shown in FIG. 18) may be transferred to the guiding system 1624 by the sorting unit 1610. The trapezoid shaped solar cell pieces may be transported from the sorting unit 1610 to the assembling unit 1634 by the guiding system 1624. The assembling unit 1634 may be adapted for assembling a shingled solar cell arrangement including, e.g., trapezoid shaped solar cell pieces only.

A trapezoid shaped solar cell piece may be retrieved from the storing unit 50 and transferred to the guiding system 1624. The trapezoid shaped solar cell piece retrieved from the storing unit 50 may be included as the last solar cell piece of a solar cell arrangement assembled by the assembling unit 1634.

Likewise, the third processing line may include a sorting unit 1612, two guiding systems 1626 and 1628 and two assembling units 1636 and 1638.

The first processing line, as described herein, may not include the second cleaving unit. The second cleaving unit may be arranged at a distance from the first processing line. The first processing line may not include the second transportation system. The second transportation system may be arranged at a distance from the first processing line. The first processing line may not include the assembling unit of the second processing line or any assembling unit for assembling a solar cell arrangement comprising a plurality of overlapping solar cell pieces. The first processing line is not configured as an assembling line for assembling a solar cell arrangement comprising a plurality of overlapping solar cell pieces.

The second processing line, as described herein, may include an adhesive application unit. An adhesive application unit may be adapted for applying an adhesive, as described herein, to a solar cell piece or solar cell. An adhesive application unit may be an adhesive printing unit adapted for printing an adhesive on a solar cell piece or solar cell.

The second processing line, as described herein, may include a curing unit. The curing unit may be configured for curing a solar cell arrangement of overlapping solar cell pieces. A curing unit may include a heating device. A heating device can be selected from the group consisting of conduction heaters (e.g., hot plates), convective heaters, resistive heaters, infrared heaters, lamp heaters, hot air heaters, and any combination thereof.

The second processing line may not include the first cleaving unit. The first cleaving unit may be arranged at a distance from the second processing line. The second processing line may not include the first transportation system. The first transportation system may be arranged at a distance from the second processing line. The second processing line may not include the first transfer area of the first processing line. The first transfer area may be arranged at a distance from the second processing line.

Figure 17:
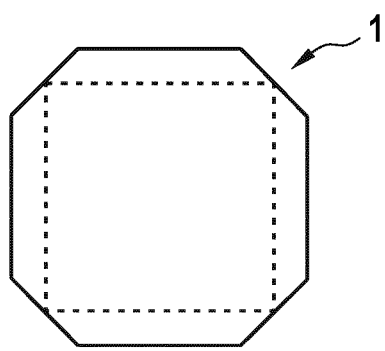
FIGS. 17-18 show an example of a solar cell and solar cell pieces obtained by cleaving the solar cell.
Figure 18:
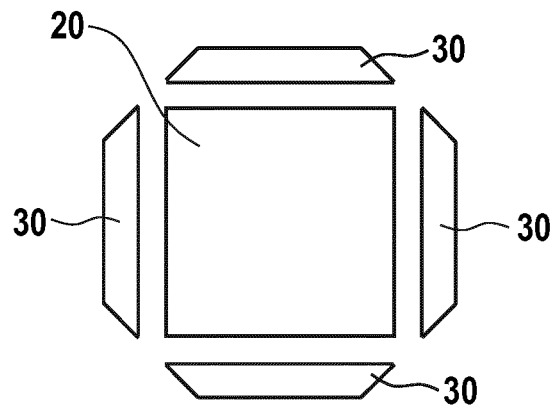

FIG. 17 shows an example of a solar cell 1 as described herein. The dashed lines in FIG. 17 indicate locations at which the solar cell 1 may be cleaved. The cleaving of the solar cell 1 along the dashed lines shown in FIG. 17 separates the solar cell 1 into five solar cell pieces or shingles, namely a rectangular solar cell piece 20 and four smaller trapezoid-shaped solar cell pieces 30, as shown in FIG. 18.

Figure 19:
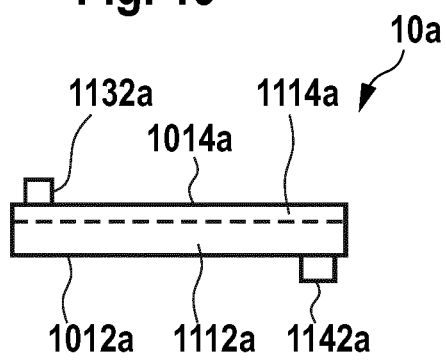
FIG. 19 shows an example of a first solar cell piece of a solar cell arrangement.

FIG. 19 shows an example of a solar cell piece 10*a* as processed on the first processing line. The solar cell piece 10*a* may serve as a last solar cell piece of a solar cell arrangement, as described herein. The solar cell piece 10*a* shown in FIG. 19 has a back side 1012*a* and a front side 1014*a* opposite the back side 1012*a*. The solar cell piece 10*a* includes a photovoltaic area 1114*a*. The solar cell piece 10*a* includes a back side area 1112*a*.

As shown for example in FIG. 19, a solar cell piece 10*a* may include a bus bar 1132*a*. The bus bar 1132*a* may be provided on the front side of the solar cell piece 10*a*. The solar cell piece 10*a* may include a bus bar 1142*a*. The bus bar 1142*a* may be provided on the back side of the solar cell piece 10*a*.

As shown for example in FIG. 19, a solar cell piece 10*a* may not include an adhesive for connecting the solar cell piece 10*a* to a further solar cell piece. Particularly, the solar cell piece 10*a* may not include an adhesive on the bus bar 1132*a*.

Figure 20:
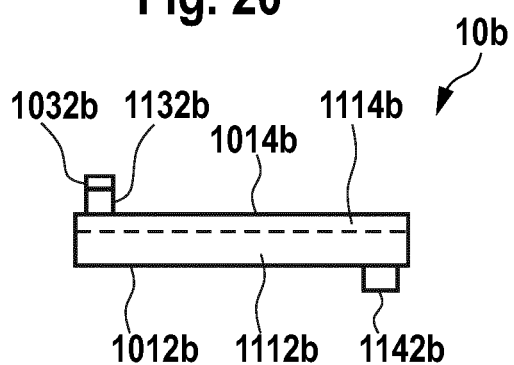
FIG. 20 shows an example of a second solar cell piece of a solar cell arrangement.

FIG. 20 shows an example of a solar cell piece 10*b* as processed on an assembling line, e.g. the second processing line, of the apparatus as described herein. The solar cell piece 10*b* has a back side 1012*b* and a front side 1014*b* opposite the back side 1012*b*. The solar cell piece 10*b* includes a photovoltaic area 1114*b*. The solar cell piece 10*b* includes a back side area 1112*b*.

As shown for example in FIG. 20, a solar cell piece 10*b* may include a bus bar 1132*b*. The bus bar 1132*b* may be provided on the front side of the solar cell piece 10*b*. The solar cell piece 10*b* may include a bus bar 1142*b*. The bus bar 1142*b* may be provided on the back side of the solar cell piece 10*b*.

As shown for example in FIG. 20, a solar cell piece 10*b* may include an adhesive 1032*b*. The adhesive 1032*b* may be provided on the front side of the solar cell piece 10*b*. The adhesive 1032*b* may be provided on the bus bar 1132*b*.

An adhesive, as described herein, is configured for connecting, particularly attaching, solar cell pieces to each other. An adhesive can be an electrically conductive adhesive (ECA). An adhesive can be selected from the group consisting of solder, silver paste, silicone-based electrically conductive adhesive, and epoxy-based electrically conductive adhesive. An adhesive can be printed on a solar cell or solar cell piece. During printing, the adhesive can be in a substantially liquid form. Alternative to printing the adhesive, a pre-formed adhesive can be applied to a solar cell or solar cell piece. An adhesive can provide for an electrical and mechanical connection between solar cell pieces in a shingled solar cell arrangement.

Figure 21:
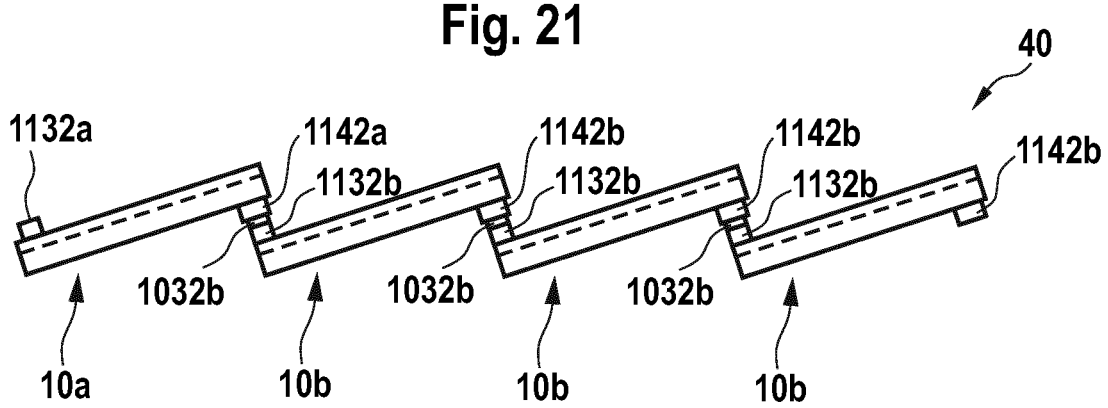
FIG. 21 shows an example of a solar cell arrangement comprising a plurality of overlapping solar cell pieces.

FIG. 21 shows a solar cell arrangement 40, e.g. a shingled solar cell arrangement, according to embodiments described herein. The shingled solar cell arrangement can be manufactured according to embodiments of the method described herein. The solar cell arrangement 40 includes a plurality of solar cell pieces 10*b*. Each solar cell piece 10*b* shown in FIG. 21 can be a solar cell piece as shown in FIG. 20.

The solar cell arrangement 40 shown in FIG. 21 includes a solar cell piece 10*a*. The solar cell piece 10*a* can be a solar cell piece 10*a* as shown in FIG. 19. The solar cell piece 10*a* as shown in FIG. 21 is the last solar cell piece of the solar cell arrangement 40.

As shown for example in FIG. 21, in a solar cell arrangement 40, a solar cell piece 10*a* may be connected to an adjacent solar cell piece 10*b*. The solar cell piece 10*a* may be connected to the adjacent solar cell piece 10*b* by an adhesive 1032*b* provided on the front side of the adjacent solar cell piece 10*b*. The adhesive 1032*b* may connect the bus bar 1142*a* on the back side of the solar cell piece 10*a* to the bus bar 1132*b* on the front side of the adjacent solar cell piece 10*b*.

According to a further embodiment, an apparatus 500 is provided.

The apparatus may include a storing unit 50 adapted for storing a plurality of solar cell pieces, as described herein.

The apparatus may include a first processing line 100 as described herein. The first processing line 100 may include a first cleaving unit 110 adapted for separating a first solar cell into solar cell pieces. The first processing line 100 may include a first transportation system 120 adapted for transporting a solar cell piece from the first cleaving unit to a first transfer area 150 of the first processing line.

The apparatus may include a second processing line 200 as described herein. The second processing line 200 may include a second cleaving unit 210 adapted for separating a second solar cell into solar cell pieces. The second processing line 200 may include an assembling unit 230 for assembling a solar cell arrangement comprising a plurality of overlapping solar cell pieces. The second processing line 200 may include a second transportation system 220 at least adapted for transporting a solar cell piece from a second transfer area 250 of the second processing line 200 to the assembling unit 230.

The apparatus 500 is adapted for transferring a solar cell piece from the first transfer area 150 of the first processing line 100 to the storing unit 50 and for transferring the solar cell piece from the storing unit 50 to the second transfer area 250 of the second processing line 200, as described herein.

According to a further embodiment, a method is provided. The method includes separating a first solar cell into a first plurality of solar cell pieces using a first cleaving unit. The first plurality of solar cell pieces includes a first solar cell piece. The method includes storing the first solar cell piece in a storing unit. The method may include retrieving the first solar cell piece from the storing unit. The method includes transporting the first solar cell piece from the storing unit to an assembling unit. The method includes separating a second solar cell into a second plurality of solar cell pieces using a second cleaving unit, the second plurality of solar cell pieces comprising a second solar cell piece. The method includes transporting the second solar cell piece to the assembling unit. The method includes assembling a solar cell arrangement using the assembling unit, the solar cell arrangement comprising a plurality of overlapping solar cell pieces, the solar cell arrangement comprising the first solar cell piece and the second solar cell piece.

A solar cell arrangement, as described herein, may be a shingled solar cell arrangement.

A solar cell piece 10*a*, as shown in the figures, is an example of a first solar cell piece as described herein. A solar cell piece 10*b*, as shown in the figures, is an example of a second solar cell piece as described herein.

Transporting the first solar cell piece from the storing unit to the assembling unit may include transporting the first solar cell piece on a first processing line as described herein. Transporting the first solar cell piece from the storing unit to the assembling unit may include transporting the first solar cell piece on a second processing line as described herein.

Transporting the second solar cell piece to the assembling unit may include transporting the second solar cell piece on the second processing line.

The method may include transporting the first solar cell piece from the first cleaving unit to the storing unit. Transporting the first solar cell piece from the first cleaving unit to the storing unit may include transporting the first solar cell piece on the first processing line. The method may include transporting the first solar cell piece from the first cleaving unit to a first transfer area, e.g. a pick-up area, of the first processing line.

The method may include transferring the first solar cell piece from a position on the first processing line to the storing unit. The method may include transferring the first solar cell piece from the first transfer area to the storing unit.

The method may include transferring the first solar cell piece from the storing unit to a second transfer area, e.g. a drop-off area, on the second processing line. The method may include transporting the first solar cell piece from the second transfer area to the assembling unit. Transporting the first solar cell piece from the second transfer area to the assembling unit may include transporting the first solar cell piece on the second processing line.

Transporting the second solar cell piece to the assembling unit may include transporting the second solar cell piece from the second cleaving unit to the assembling unit.

The method may include moving the storing unit including the first solar cell piece from a first storing unit position, as described herein, to a second storing unit position, as described herein.

The first solar cell piece, as described herein, may be an outermost solar cell piece of the solar cell arrangement. An outermost solar cell piece of a solar cell arrangement may be a last solar cell piece of the solar cell arrangement, e.g. solar cell piece 10a as shown in FIG. 21. A solar cell arrangement may have a single last solar cell piece. The back side of the last solar cell piece of a solar cell arrangement may be connected to the front side of an adjacent solar cell piece of the solar cell arrangement, e.g. by an adhesive as described herein.

The first solar cell piece, as described herein, may not include an adhesive for connecting the first solar cell piece to an adjacent solar cell piece of the solar cell arrangement.

The second solar cell piece, as described herein, may include an adhesive as described herein. The adhesive may be provided on the front side of the second solar cell piece. The second solar cell piece may include a bus bar. The adhesive may be provided on the bus bar.

Assembling the solar cell arrangement, as described herein, may include connecting the first solar cell piece to the second solar cell piece, e.g. by an adhesive as described herein, particularly an adhesive on the front side of the second solar cell piece.

The method may include separating a third solar cell, e.g. a solar cell 1c as shown in the figures, into a third plurality of solar cell pieces using the first cleaving unit. The third plurality of solar cell pieces may include a third solar cell piece. The method may include transporting the third solar cell piece from the first cleaving unit to a further storing unit 1550 as described herein. Transporting the third solar cell piece from the first cleaving unit to the further storing unit may include transporting the third solar cell piece on the first processing line. The method may include storing the third solar cell piece in the further storing unit.

The method may include transporting the third solar cell piece from the further storing unit to a further assembling unit. The further assembling unit may be on a third processing line 300 as described herein. Transporting the third solar cell piece from the further storing unit to the further assembling unit may include transporting the third solar cell piece on the third processing line.

The method may include separating a fourth solar cell into a fourth plurality of solar cell pieces using a third cleaving unit. The fourth plurality of solar cell pieces may include a fourth solar cell piece. The third cleaving unit may be on the third processing line.

The method may include transporting the fourth solar cell piece to the further assembling unit. Transporting the fourth solar cell piece to the further assembling unit may include transporting the fourth solar cell piece on the third processing line.

The method may include assembling a further solar cell arrangement using the further assembling unit. The further solar cell arrangement may include a further plurality of overlapping solar cell pieces. The further solar cell arrangement may include the third solar cell piece and the fourth solar cell piece. The third solar cell piece may be an outermost solar cell piece of the further solar cell arrangement.

While the foregoing is directed to embodiments of the disclosure, other and further embodiments of the disclosure may be devised without departing from the basic scope thereof, and the scope thereof is determined by the claims that follow.

The invention claimed is:

1. An apparatus, comprising:
   a control unit;
   a first processing line comprising a first cleaving unit adapted for separating a first solar cell into solar cell pieces;
   a second processing line comprising a second cleaving unit adapted for separating a second solar cell into solar cell pieces, wherein the second processing line comprises an assembling unit to assemble a solar cell arrangement comprising a plurality of overlapping solar cell pieces; and
   a storing unit adapted for storing a plurality of solar cell pieces, wherein each solar cell piece of the plurality of solar cell pieces does not include an electrically conductive adhesive for connecting a solar cell piece to an adjacent solar cell piece of the solar cell arrangement,
   wherein the first processing line including the first cleaving unit is arranged for supplying solar cell pieces not having the electrically conductive adhesive to fill the storing unit, the apparatus being adapted for transferring, under the control of the control unit, a solar cell piece not having the electrically conductive adhesive from a first position on the first processing line to the storing unit,
   the apparatus being adapted for transferring, under the control of the control unit, the solar cell piece not having the electrically conductive adhesive from the storing unit to a second position on the second processing line, wherein the solar cell piece is retrieved from the storing unit depending on a process condition of the second processing line, wherein the solar cell piece is transported on the second processing line to the assembling unit.

2. The apparatus of claim 1, wherein the first processing line comprises a first transfer area, the apparatus being adapted for transferring a solar cell piece from the first transfer area to the storing unit.

3. The apparatus of claim 2, wherein the first processing line comprises a first transportation system adapted for transporting a solar cell piece from the first cleaving unit to the first transfer area.

4. The apparatus of claim 1, wherein the second processing line comprises a second transfer area, the apparatus being adapted for transferring a solar cell piece from the storing unit to the second transfer area.

5. The apparatus of claim 1, wherein the second processing line comprises a second transportation system adapted for transporting a solar cell piece from the second cleaving unit to the assembling unit.

6. The apparatus of claim 1, wherein the storing unit is moveable from a first storing unit position for receiving a solar cell piece from the first processing line to a second storing unit position for supplying the solar cell piece to the second processing line.

7. The apparatus of claim 1, the apparatus further comprising:
a further storing unit adapted for storing a further plurality of solar cell pieces; and
a third processing line adapted for processing solar cell pieces,
the apparatus being adapted for transferring a solar cell piece from a position on the first processing line to the further storing unit and for transferring the solar cell piece from the further storing unit to a position on the third processing line.

8. The apparatus of claim 1, wherein the first processing line does not include an adhesive printing unit for printing an adhesive on a solar cell piece.

9. The apparatus of claim 1, wherein the first processing line is not configured as an assembling line for assembling a solar cell arrangement comprising a plurality of overlapping solar cell pieces.

10. An apparatus, comprising:
a control unit;
a first processing line, comprising:
a first cleaving unit adapted for separating a first solar cell into solar cell pieces; and
a first transportation system adapted for transporting a solar cell piece from the first cleaving unit to a first transfer area of the first processing line;
a second processing line, comprising:
a second cleaving unit adapted for separating a second solar cell into solar cell pieces;
an assembling unit adapted for assembling a solar cell arrangement comprising a plurality of overlapping solar cell pieces; and
a second transportation system at least adapted for transporting a solar cell piece from a second transfer area of the second processing line to the assembling unit; and
a storing unit adapted for storing a plurality of solar cell pieces, wherein each solar cell piece of the plurality of solar cell pieces does not include an electrically conductive adhesive for connecting the solar cell piece to an adjacent solar cell piece of the solar cell arrangement;
wherein the first processing line including the first cleaving unit is arranged for supplying solar cell pieces not having the electrically conductive adhesive to fill the storing unit,
the apparatus being adapted, under the control of the control unit, for transferring a solar cell piece not having the electrically conductive adhesive from the first transfer area of the first processing line to the storing unit and for transferring the solar cell piece not having the electrically conductive adhesive from the storing unit to the second transfer area of the second processing line, wherein the solar cell piece is retrieved from the storing unit depending on a process condition of the second processing line, wherein the solar cell piece is transported on the second processing line to the assembling unit.

11. A method, comprising:
separating a first solar cell into a first plurality of solar cell pieces using a first cleaving unit arranged on a first processing line, the first plurality of solar cell pieces comprising a first solar cell piece, wherein the first solar cell piece does not include an adhesive for connecting the first solar cell piece to an adjacent solar cell piece of a solar cell arrangement;
storing the first solar cell piece not having an electrically conductive adhesive in a storing unit;
transporting the first solar cell piece not having the electrically conductive adhesive from the storing unit to an assembling unit of a second processing line, wherein the first solar cell piece is retrieved from the storing unit depending on a process condition of the second processing line;
separating a second solar cell into a second plurality of solar cell pieces using a second cleaving unit arranged on the second processing line, the second plurality of solar cell pieces comprising a second solar cell piece;
transporting the second solar cell piece to the assembling unit; and
assembling the solar cell arrangement using the assembling unit, the solar cell arrangement comprising a plurality of overlapping solar cell pieces, the solar cell arrangement comprising the first solar cell piece not having the electrically conductive adhesive and the second solar cell piece.

12. The method of claim 11, wherein the first solar cell piece is an outermost solar cell piece of the solar cell arrangement.

13. The method claim 11, further comprising:
transporting the first solar cell piece from the first cleaving unit to a first transfer area of the first processing line; and
transferring the first solar cell piece from the first transfer area to the storing unit.

14. The method of claim 11, further comprising:
transferring the first solar cell piece from the storing unit to a second transfer area on the second processing line; and
transporting the first solar cell piece from the second transfer area to the assembling unit.

15. The method of claim 11, further comprising at least one of the following:
controlling a transfer of the first solar cell piece from a position on the first processing line to the storing unit; and
controlling a transfer of the first solar cell piece from the storing unit to a position on the second processing line.

16. The method of claim 11, further comprising:
moving the storing unit including the first solar cell piece from a first storing unit position to a second storing unit position.

17. The method of claim 11, wherein assembling the solar cell arrangement includes connecting the first solar cell piece to the second solar cell piece by an adhesive.

* * * * *